(12) United States Patent
Gassner

(10) Patent No.: US 9,774,199 B2
(45) Date of Patent: Sep. 26, 2017

(54) PRESS-TO-HIDE STYLE USB HAND CONTROLLER

(71) Applicant: LIMOSS (SHENZHEN) CO.,LTD, Guangdong (CN)

(72) Inventor: Christian Gassner, Bao'an District (CN)

( * ) Notice: Subject to any disclaimer, the term of this patent is extended or adjusted under 35 U.S.C. 154(b) by 133 days.

(21) Appl. No.: 14/683,951

(22) Filed: Apr. 10, 2015

(65) Prior Publication Data

US 2016/0268821 A1 Sep. 15, 2016

(30) Foreign Application Priority Data

Mar. 10, 2015 (CN) .................. 2015 2 01343329 U

(51) Int. Cl.
*H02J 7/00* (2006.01)
*G05G 1/02* (2006.01)
*H05K 5/02* (2006.01)

(52) U.S. Cl.
CPC .............. *H02J 7/0042* (2013.01); *G05G 1/02* (2013.01); *H02J 7/0052* (2013.01); *H05K 5/0278* (2013.01); *H02J 2007/0062* (2013.01)

(58) Field of Classification Search
CPC .................. H02J 7/0042; H02J 7/0052; H02J 2007/0062; H05K 5/0278; G05G 1/02
USPC ........................................ 320/107
See application file for complete search history.

(56) References Cited

U.S. PATENT DOCUMENTS

| 8,014,130 B1* | 9/2011 | Nguyen | H01R 13/447 361/600 |
| 2006/0108979 A1* | 5/2006 | Daniel | H01M 2/105 320/112 |
| 2007/0015407 A1* | 1/2007 | Loftus | H01R 13/4538 439/607.01 |

* cited by examiner

*Primary Examiner* — Nathaniel Pelton
(74) *Attorney, Agent, or Firm* — James M. Smedley LLC; James Michael Smedley, Esq.

(57) ABSTRACT

The present invention discloses a press-to-hide USB hand controller, wherein, it comprises a remoter body, where a lifter mechanism is configured in the said remoter body and a USB interface is configured in the said lifter mechanism, while the said USB interface connects to a charging circuit. The said press-to-hide style USB hand controller in the present invention, adds a USB charging function, which can not only fulfill the regular remoter control function, but its USB interface is able to charge almost all intelligent devices in the market, comprising almost all cell phones and tablets, thus when people are using intelligent devices while experiencing home furnishing, they will no longer worry about short of batteries. The telescopic pop-out structure makes the product save more spaces, be used conveniently and coordinate with the whole product structure, which is a more clever design.

5 Claims, 5 Drawing Sheets

PRESS-TO-HIDE STYLE USB HAND CONTROLLER

FIELD OF THE INVENTION

The present invention relates to the field of remote control devices technology area, and more particularly, to a press-to-hide style USB (Universal Serial Bus) hand controller.

CROSS-REFERENCES TO RELATED APPLICATIONS

This application claims the priority of Chinese patent application no. 2015201343329, filed on Mar. 10, 2015, the entire contents of all of which are incorporated herein by reference.

BACKGROUND

In the era of mobile internet, the ways of people's leisure and work are undergoing tremendous changes, people may use intelligent devices (such as in intelligent phones, tablets, intelligent watches and more) on various occasions for entertainment or work, however, the problem of battery runtime of these devices may bring troubles to users, which means these devices may need to be charged any time. A traditional product has a single remote function or charging function only, which has been unable to adapt to the people's life requirements in the internet era.

Therefore, the prior art needs to be improved and developed.

BRIEF SUMMARY OF THE DISCLOSURE

In view of the defects of the prior art, the present invention is aiming at providing a press-to-hide style USB hand controller, in order to solve the problem in the prior art, that the existing remoter products have no recharging functions.

The technical solution of the present invention to solve the said technical problems is as follows:

A press-to-hide style USB hand controller, wherein, it comprises a remoter body, where a lifter mechanism is configured in the said remoter body, and a USB interface is configured in the said lifter mechanism, while the said USB interface connects to a charging circuit.

The said press-to-hide style USB hand controller, wherein, the said lifter mechanism comprises a lifter body, a spring and a fixed hook, the said spring is configured at a bottom of the lifter body, the said fixed hook is configured at a side of the lifter body, an outer shell is configured to cover the said lifter body, a lifting rail is configured in the side wall of the said outer shell, the said fixed hook finish lifting and fixing actions in the said lifting rail by the spring, to drive the lifter body lifting.

The said press-to-hide style USB hand controller, wherein, a press button is configured in the said remoter body, the said press button is configured on a top of the lifter mechanism.

The said press-to-hide style USB hand controller, wherein, the said press button is composed of two residual circles.

The said press-to-hide style USB hand controller, wherein, a display lamp is configured in the said press button.

The said press-to-hide style USB hand controller, wherein, a fixing corner is configured at the bottom of the lifting rail, used to hold the fixed hook when it is lowered to the bottom.

The said press-to-hide style USB hand controller, wherein, the said press-to-hide style USB hand controller is a cylindrical press-to-hide USB hand controller.

Benefits: the press-to-hide style USB hand controller, adds a USB charging function, which can not only fulfill the regular remoter control function, but also its USB interface is able to supply power to charge almost all intelligent devices in the market, comprising almost all intelligent phones and tablets, thus when people are using intelligent devices while experiencing home furnishing, they will no longer worry about short of batteries. The telescopic pop-out structure makes the product save more spaces, be used conveniently and coordinate with the whole structure of the product, which is a more clever design.

DETAILED DESCRIPTION

The present invention discloses a press-to-hide style USB hand controller. In order to make the purpose, technical solution and the advantages of the present invention clearer and more explicit, further detailed descriptions of the present invention are stated here, referencing to the attached drawings and some embodiments of the present invention. It should be understood that the detailed embodiments of the invention described here are used to explain the present invention only, instead of limiting the present invention.

Figure 1:
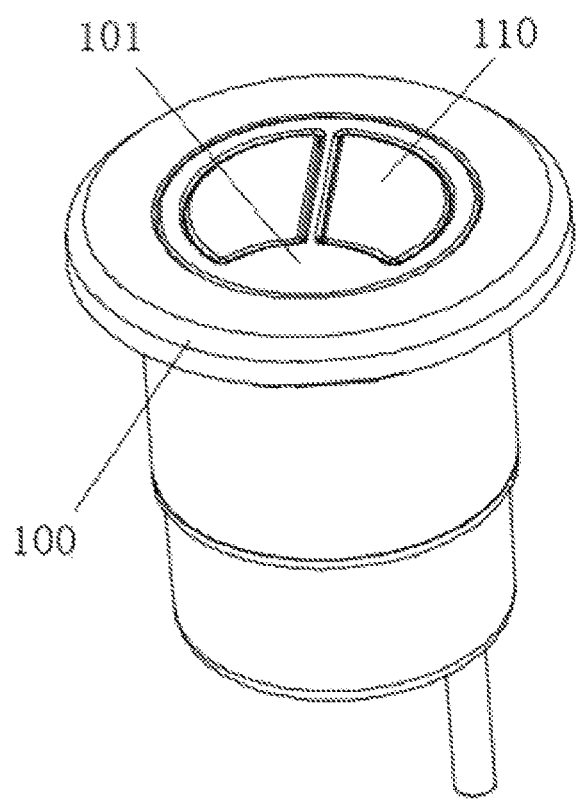
FIG. 1 illustrates a schematic diagram of a press-to-hide style USB hand controller in the present invention before expanding.
Figure 2:
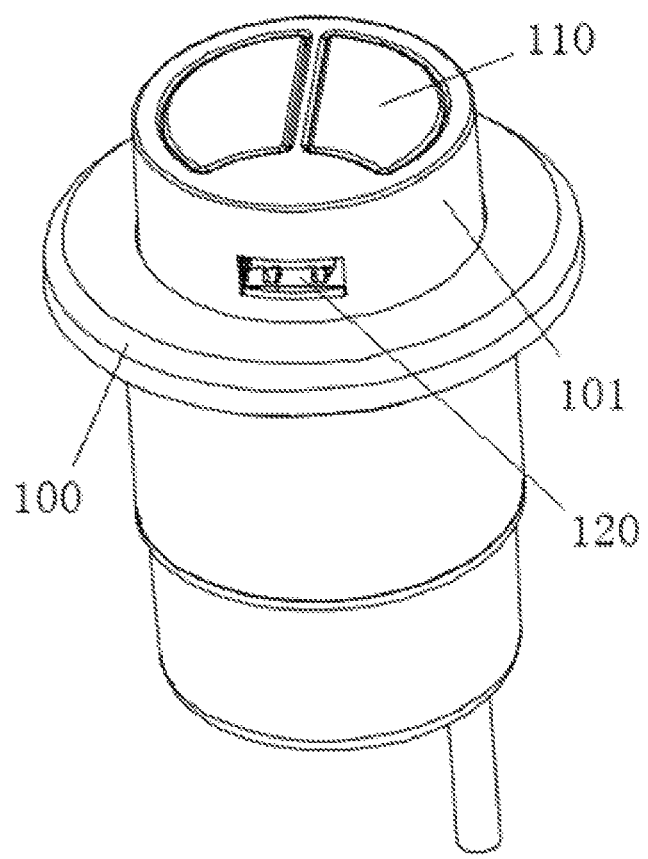
FIG. 2 illustrates a schematic diagram of the press-to-hide style USB hand controller in the present invention after expanding.

Referred to FIG. 1, which illustrates a schematic diagram on a preferred embodiment of a press-to-hide style USB hand controller in the present invention, shown as FIG. 1, it comprises a remoter body 100, a lifter mechanism 101 is configured in the said remoter body 100, as shown in FIG. 2, a USB interface 120 is configured in the said lifter mechanism 101, the said USB interface 120 connects to a charging circuit.

In the embodiment of the present invention, by providing a shiftable lifter mechanism 101 in the remoter body 100, and providing a USB interface 120, so that when charging intelligent devices through the said USB interface 120, it will not affect the daily usage of the remoter, while providing charging services anytime. Also, the USB interface 120 can be hidden, which makes it possible to protect the interface.

Figure 3:
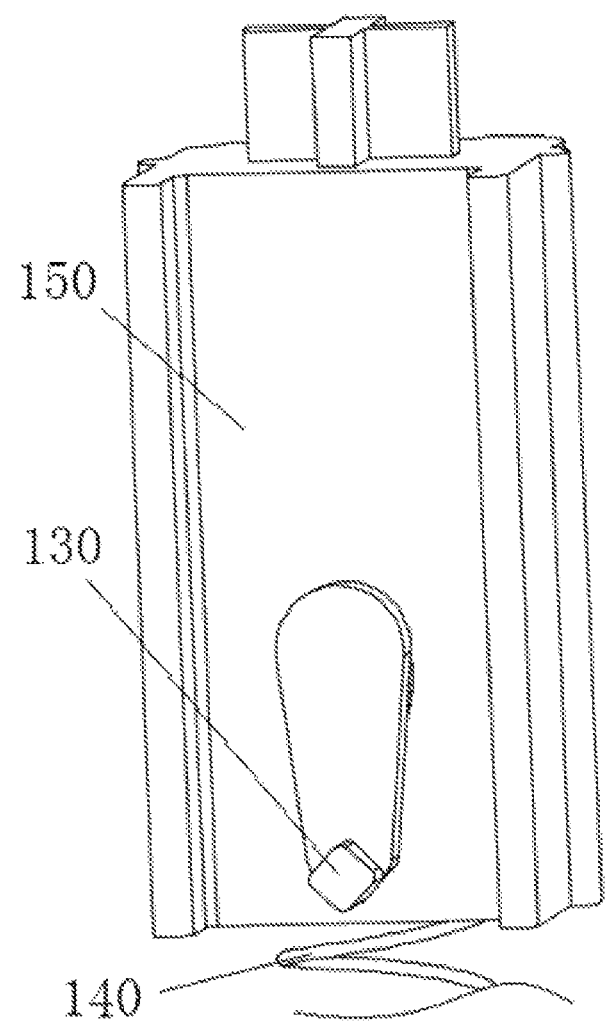
FIG. 3 illustrates a schematic diagram of a lifter body in a lifter mechanism in the present invention.
Figure 4:
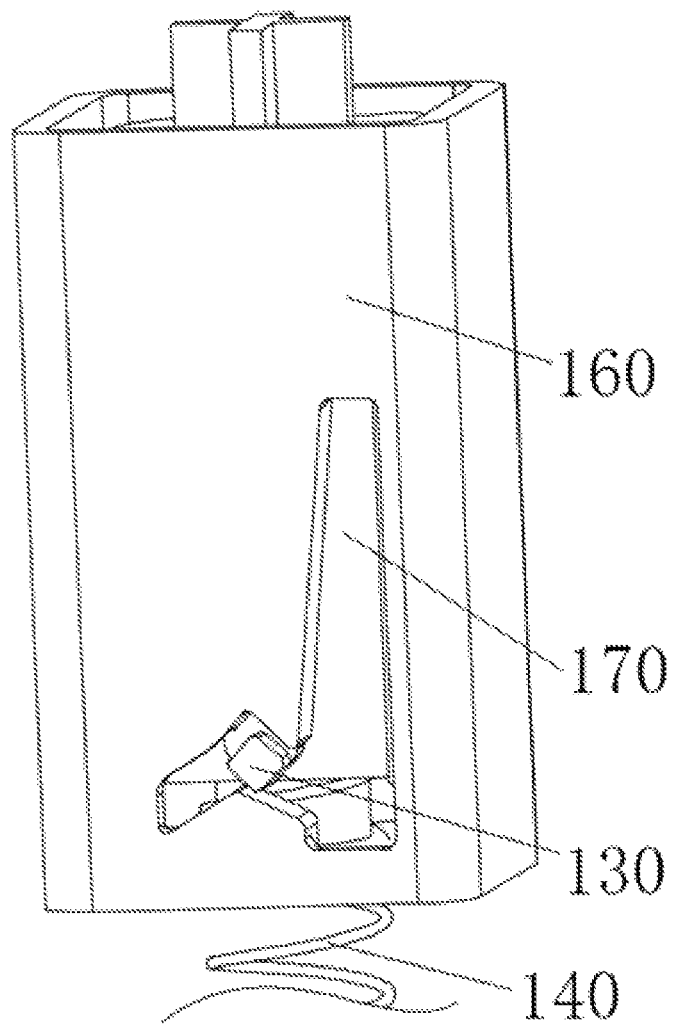
FIG. 4 illustrates a schematic diagram of the lifter mechanism before expanding in the present invention.
Figure 5:
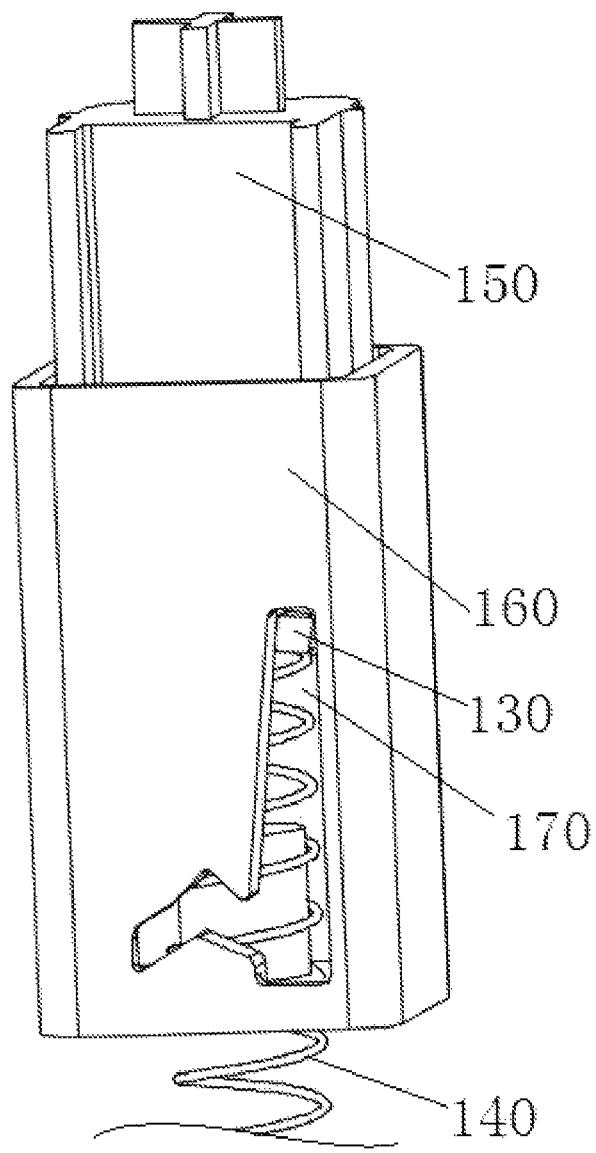
FIG. 5 illustrates a schematic diagram of the lifter mechanism after expanding in the present invention.

Furthermore, combining FIG. 3 up to FIG. 5, the said lifter mechanism 101 comprises a lifter body 150, a spring 140 and a fixed hook 130, the said spring 140 is configured at a bottom of the lifter body 150, the said fixed hook 130 is configured at a side of the lifter body 150, an outer shell 160 is configured to cover the said lifter body 150, a lifting rail 170 is configured in the side wall of the said outer shell 160, the said fixed hook 130 finishes lifting and fixing actions in the said lifting rail 170 by the spring 140, to drive the lifting body 150 lifting, and exposes the USB interface 120 on a top, while an intelligent device is inserted into the USB interface 120 and charging. That is, the USB interface in the present invention is able to be hidden, when it is not in use, it is hidden to protect the interface, avoiding dusts and damages. It exposes only when in use, while the said USB interface 120 is designed at the side wall of the lifter mechanism, thus the design is very clever.

A fixing corner is configured at the bottom of the lifting rail 170, used to hold the fixed hook 130 when it is lowered to the bottom. So that, when the fixed hook 130 is lowered to the bottom of the lifting rail 170, the fixed hook 130 will hook the fixing corner automatically, thus compress the spring 140, let the lifter body 150 lower to the bottom, and hide the USB interface 120. And while the fixed hook 130 rises to the top of the lifting rail 170, whose top block the fixed hook 130, thus making the lifter body 150 be fixed on the top, and expose the USB interface 120.

A press button 110 is configured in the said remoter body 100, the said press button is configured on the top of the lifter mechanism 101, while the said press button 110 is composed of two residual circles. Displaying lamp is configured on the press button 110, that is, displaying lights at the position of the press button 110, thus being convenient for operations.

The working processes of the present invention are: when the charging function is needed, press down the top of the lifter body 150 (the areas outside the press button 110), and making the USB interface 120 pop-out automatically, now connecting a rechargeable device will start to charge, after charging, press down the top of the lifter body 150 again, and the USB interface 120 gets hidden automatically, now the top of the lifter mechanism 101 lowers to same level of the outer shell of the remoter body 100, thus effectively protect the charging interface, and more beautiful. Additionally, under any conditions, the remote control function of the remoter can still be used normally.

In the present invention, the said press-to-hide style USB hand controller is a cylindrical shaped press-to-hide style USB hand controller, but, obviously, it is not limited to the above mentioned structure, it can also be a remoter in other shapes and forms.

All above, the press-to-hide style USB hand controller, adds a USB charging function, which can not only fulfill the regular remoter control function, but also its USB interface is able to supply power to charge almost all intelligent devices in the market, comprising almost all cell phones and tablets, thus when people are using intelligent devices while experiencing home furnishing, they will no longer worry about short of batteries. And the telescopic pop-out structure makes the product save more spaces, use conveniently and coordinate with the whole structure of the product, which is a more clever design.

It should be understood that, the application of the present invention is not limited to the above examples listed. It will be possible for a person skilled in the art to make modification or replacements according to the above descriptions, which shall all fall within the scope of protection in the appended claims of the present invention.

What is claimed is:

1. A press-to-hide style USB remote controller comprising a remote controller body, wherein a lifter mechanism is configured in the remote controller body and a USB interface is configured in the lifter mechanism, wherein the lifter body is configured with a top that upon pressing lifts or hides the USB, wherein the USB interface connects to a charging circuit, and wherein said lifter mechanism comprises a lifter body, a spring and a fixed hook, the spring is configured at a bottom of the lifter body, the fixed hook is immovably connected to a side of the lifter body, an outer shell is configured to cover the lifter body, a lifting rail is configured in the side wall of the said outer shell, the lifting rail has a lifting portion and a fixing corner, and the fixed hook is configured to perform a lifting action in the lifting rail by release of the spring, to drive the lifter body lifting thereby exposing the USB interface, and a fixing action when the fixing hook moves into the fixing corner through compression of the spring thereby hiding the USB interface, wherein the fixing corner is configured at the bottom of the lifting rail to hold the fixed hook when the fixed hook is lowered to the bottom of the lifting rail.

2. The press-to-hide style USB remote controller according to claim 1, wherein a press button is configured in said remote controller body, and the press button is configured on a top of the lifter mechanism.

3. The press-to-hide style USB remote controller according to claim 2, wherein said press button comprises two residual circles.

4. The press-to-hide style USB remote controller according to claim 2, wherein a display lamp is configured in said press button.

5. The press-to-hide style USB remote controller according to claim 1, which is cylindrical.

* * * * *